(12) United States Patent
Schlub et al.

(10) Patent No.: US 8,577,289 B2
(45) Date of Patent: Nov. 5, 2013

(54) ANTENNA WITH INTEGRATED PROXIMITY SENSOR FOR PROXIMITY-BASED RADIO-FREQUENCY POWER CONTROL

(75) Inventors: Robert W. Schlub, Cupertino, CA (US); Yi Jiang, Sunnyvale, CA (US); Qingxiang Li, Mountain View, CA (US); Jiang Zhu, Sunnyvale, CA (US); Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 316 days.

(21) Appl. No.: 13/029,581

(22) Filed: Feb. 17, 2011

(65) Prior Publication Data

US 2012/0214412 A1    Aug. 23, 2012

(51) Int. Cl.
*H04B 5/00* (2006.01)
(52) U.S. Cl.
USPC ............ 455/41.1; 343/702; 343/872; 379/44; 379/388
(58) Field of Classification Search
USPC ............................ 455/41.1, 41.3, 41.7, 550.1
See application file for complete search history.

(56) References Cited

U.S. PATENT DOCUMENTS

| | | | |
|---|---|---|---|
| 4,546,357 A | 10/1985 | Laughon et al. | |
| 5,337,353 A * | 8/1994 | Boie et al. | 379/433.01 |
| 5,463,406 A | 10/1995 | Vannatta et al. | |
| 5,650,597 A | 7/1997 | Redmayne | |
| 5,826,458 A | 10/1998 | Little | |
| 5,854,972 A | 12/1998 | Pennock et al. | |
| 5,864,316 A | 1/1999 | Bradley et al. | |
| 5,905,467 A | 5/1999 | Narayanaswamy et al. | |
| 5,917,450 A | 6/1999 | Tsunekawa et al. | |
| 5,956,626 A | 9/1999 | Kashke et al. | |
| 6,124,831 A | 9/2000 | Rutkowski et al. | |

(Continued)

FOREIGN PATENT DOCUMENTS

| | | |
|---|---|---|
| DE | 102005035935 | 2/2007 |
| EP | 0564164 | 10/1993 |

(Continued)

OTHER PUBLICATIONS

Myllymaki S et al. "Capacitive recognition of the user's hand grip position in mobile handsets", Progress in Electromagnetics Research B, vol. 22, 2010, pp. 203-220.

(Continued)

*Primary Examiner* — Edward Urban
*Assistant Examiner* — Max Mathew
(74) *Attorney, Agent, or Firm* — Treyz Law Group; G. Victor Treyz; Michael H. Lyons

(57) ABSTRACT

An electronic device may have a housing in which an antenna is mounted. An antenna window may be mounted in the housing to allow radio-frequency signals to be transmitted from the antenna and to allow the antenna to receive radio-frequency signals. Near-field radiation limits may be satisfied by reducing transmit power when an external object is detected in the vicinity of the dielectric antenna window and the antenna. A capacitive proximity sensor may be used in detecting external objects in the vicinity of the antenna. The proximity sensor and the antenna may be formed using integral antenna resonating element and proximity sensor capacitor electrode structures. These structures may be formed from identical first and second patterned conductive layers on opposing sides of a dielectric substrate. A transceiver and proximity sensor may be coupled to the structures through respective high-pass and low-pass circuits.

21 Claims, 10 Drawing Sheets

(56) References Cited

U.S. PATENT DOCUMENTS

| | | |
|---|---|---|
| 6,329,958 B1 | 12/2001 | McLean et al. |
| 6,380,899 B1 | 4/2002 | Madsen et al. |
| 6,384,681 B1 | 5/2002 | Bonds |
| 6,408,193 B1 | 6/2002 | Katagishi et al. |
| 6,456,250 B1 | 9/2002 | Ying et al. |
| 6,456,856 B1 | 9/2002 | Werling et al. |
| 6,529,088 B2 | 3/2003 | Lafleur et al. |
| 6,590,539 B2 | 7/2003 | Shinchi |
| 6,611,227 B1 | 8/2003 | Nebiyeloul-Kifle et al. |
| 6,657,595 B1 | 12/2003 | Phillips et al. |
| 6,664,931 B1 | 12/2003 | Nguyen et al. |
| 6,678,532 B1 | 1/2004 | Mizoguchi |
| 6,822,611 B1 | 11/2004 | Kontogeorgakis et al. |
| 6,879,293 B2 | 4/2005 | Sato |
| 6,903,686 B2 | 6/2005 | Vance et al. |
| 6,978,121 B1 | 12/2005 | Lane et al. |
| 6,985,113 B2 | 1/2006 | Nishimura et al. |
| 7,016,686 B2 | 3/2006 | Spaling |
| 7,016,705 B2 | 3/2006 | Bahl et al. |
| 7,039,435 B2 | 5/2006 | McDowell et al. |
| 7,050,010 B2 | 5/2006 | Wang et al. |
| 7,053,629 B2 | 5/2006 | Nevermann |
| 7,064,721 B2 | 6/2006 | Zafar et al. |
| 7,109,945 B2 | 9/2006 | Mori |
| 7,113,087 B1 | 9/2006 | Casebolt |
| 7,146,139 B2 | 12/2006 | Nevermann |
| 7,321,336 B2 | 1/2008 | Phillips et al. |
| 7,383,067 B2 | 6/2008 | Phillips et al. |
| 7,499,722 B2 | 3/2009 | McDowell et al. |
| 7,522,846 B1 | 4/2009 | Lewis et al. |
| 7,557,760 B2 | 7/2009 | Chang et al. |
| 7,595,759 B2 | 9/2009 | Schlub et al. |
| 7,633,076 B2 | 12/2009 | Huppi et al. |
| 7,653,883 B2 | 1/2010 | Hotelling et al. |
| 7,826,875 B2 | 11/2010 | Karaoguz et al. |
| 7,864,123 B2 | 1/2011 | Hill et al. |
| 7,876,274 B2 | 1/2011 | Hobson et al. |
| 7,896,196 B2 | 3/2011 | Wegelin et al. |
| 7,916,089 B2 | 3/2011 | Schlub et al. |
| 7,999,748 B2 | 8/2011 | Ligtenberg et al. |
| 8,159,399 B2 | 4/2012 | Dorsey et al. |
| 8,255,009 B2 | 8/2012 | Sorensen et al. |
| 8,289,248 B2 | 10/2012 | Kunkel |
| 8,301,094 B2 | 10/2012 | Ahn et al. |
| 8,325,094 B2 | 12/2012 | Ayala Vazquez et al. |
| 8,326,221 B2 | 12/2012 | Dorsey et al. |
| 2002/0094789 A1 | 7/2002 | Harano |
| 2002/0123309 A1 | 9/2002 | Collier et al. |
| 2003/0186728 A1 | 10/2003 | Manjo |
| 2003/0210203 A1 | 11/2003 | Phillips et al. |
| 2003/0218993 A1 | 11/2003 | Moon et al. |
| 2004/0176083 A1 | 9/2004 | Shiao et al. |
| 2005/0245204 A1 | 11/2005 | Vance |
| 2006/0232468 A1 | 10/2006 | Parker et al. |
| 2006/0244663 A1 | 11/2006 | Fleck et al. |
| 2007/0188375 A1 | 8/2007 | Richards et al. |
| 2007/0238496 A1 | 10/2007 | Chung et al. |
| 2008/0316120 A1 | 12/2008 | Hirota et al. |
| 2009/0096683 A1 | 4/2009 | Rosenblatt et al. |
| 2009/0305742 A1 | 12/2009 | Caballero et al. |
| 2010/0156790 A1 | 6/2010 | Su et al. |
| 2011/0012790 A1 | 1/2011 | Badaruzzaman et al. |
| 2011/0012793 A1 | 1/2011 | Amm et al. |
| 2011/0043227 A1 | 2/2011 | Pance et al. |
| 2011/0250928 A1 | 10/2011 | Schlub et al. |

FOREIGN PATENT DOCUMENTS

| | | |
|---|---|---|
| EP | 1298809 | 4/2003 |
| EP | 1469550 | 10/2004 |
| EP | 1524774 | 4/2005 |
| EP | 1564896 | 8/2005 |
| EP | 2276109 | 1/2011 |
| GB | 2380359 | 4/2003 |
| JP | 2003179670 | 6/2003 |
| JP | 2003209483 | 7/2003 |
| WO | 0131733 | 5/2001 |
| WO | 0205443 | 1/2002 |
| WO | 2005112280 | 11/2005 |
| WO | 2007116790 | 4/2006 |
| WO | 2008078142 | 7/2008 |
| WO | 2009022387 | 2/2009 |
| WO | 2009032570 | 2/2009 |
| WO | 2009149023 | 12/2009 |
| WO | 2011018551 | 2/2011 |

OTHER PUBLICATIONS

Schlub et al. U.S. Appl. No. 12/632,697, filed Dec. 7, 2009.
Amm et al. U.S. Appl. No. 12/632,695, filed Dec. 7, 2009.
"CapTouch Programmable Controller for Single-Electrode Capacitance Sensors", AD7147 Data Sheet Rev. B, [online], Analog Devices, Inc., [retrieved on Dec. 7, 2009], <URL: http://www.analog.com/static/imported-files/data_sheets/AD7147.pdf>.

* cited by examiner

ANTENNA WITH INTEGRATED PROXIMITY SENSOR FOR PROXIMITY-BASED RADIO-FREQUENCY POWER CONTROL

BACKGROUND

This relates generally to antennas, and, more particularly, to antennas for electronic devices.

Electronic devices such as portable computers and handheld electronic devices are becoming increasingly popular. Devices such as these are often provided with wireless communications capabilities. For example, electronic devices may use long-range wireless communications circuitry to communicate using cellular telephone bands. Electronic devices may use short-range wireless communications links to handle communications with nearby equipment.

It can be difficult to incorporate antennas successfully into an electronic device. Some electronic devices are manufactured with small form factors, so space for antennas is limited. In many electronic devices, the presence of electronic components in the vicinity of an antenna serves as a possible source of electromagnetic interference. Antenna operation can also be blocked by conductive structures. This can make it difficult to implement an antenna in an electronic device that contains conductive housing walls or other conductive structures that can potentially block radio-frequency signals. Limits may be imposed by regulatory bodies on the maximum amount of radio-frequency power that can be wirelessly transmitted by a device. These limits pose challenges when operating electronic device antennas at elevated power levels.

It would therefore be desirable to be able to provide electronic devices with improved wireless capabilities.

SUMMARY

An electronic device may have integral antenna resonating element and proximity sensor capacitor electrode structures formed from conductive structures such as conductive printed circuit structures.

The conductive printed circuit structures may include identical first and second patterned conductive layers on opposing sides of a printed circuit substrate. The first and second layers may be electrically isolated and may serve as first and second capacitor electrodes for a proximity sensor in the electronic device. The first and second layers may also be coupled to a radio-frequency transceiver and can serve as an antenna resonating element that, together with a ground plane in the electronic device, forms an antenna for the electronic device.

The radio-frequency transceiver may be coupled to the conductive printed circuit structures through a high-pass circuit such as a pair of capacitors. A first of the capacitors may be interposed between a first transmission line conductor and the first patterned conductive layer and a second of the capacitors may be interposed between a second transmission line conductor and the first patterned conductive layer. At frequencies associated with wireless signals, the impedance between the first and second patterned conductive layers is relatively small, so both the first and second patterned conductive layers in the conductive printed circuit structures can be used in transmitting and receiving antenna signals. At lower frequencies, such as those associated with making proximity sensor capacitance measurements, the first and second patterned conductive layers may serve as respective first and second capacitor electrodes for measuring the proximity of nearby external objects. When the presence of a nearby object is detected, limits may be imposed on the maximum allowable transmit power for the radio-frequency transceiver.

Further features of the invention, its nature and various advantages will be more apparent from the accompanying drawings and the following detailed description of the preferred embodiments.

DETAILED DESCRIPTION

Figure 1:
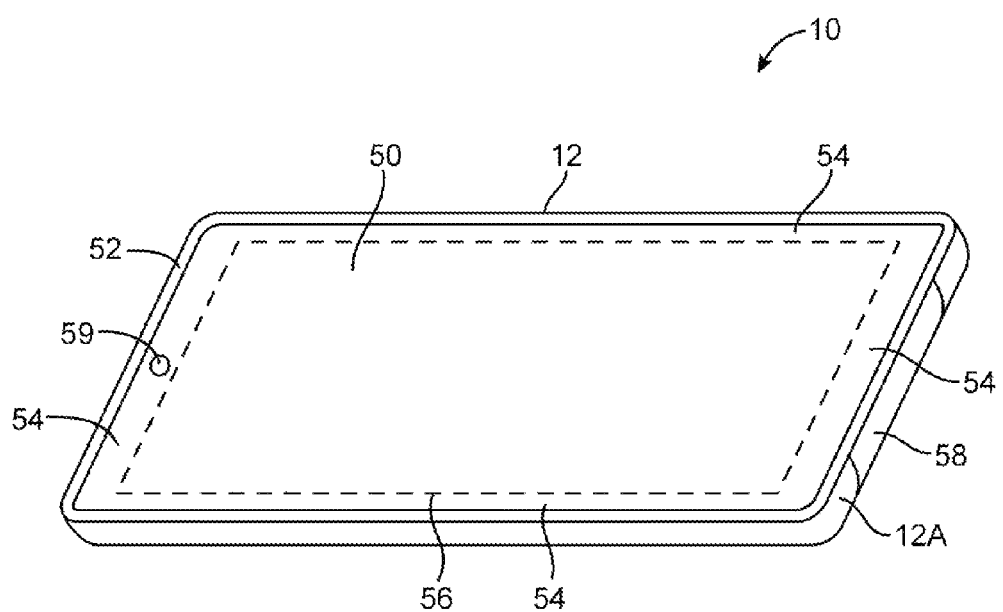
FIG. 1 is a front perspective view of an illustrative electronic device of the type that may be provided with an integral antenna and proximity sensor structure in accordance with an embodiment of the present invention.

Electronic devices may be provided with wireless communications circuitry. The wireless communications circuitry may be used to support wireless communications in one or more wireless communications bands. For example, the wireless communications circuitry may transmit and receive signals in cellular telephone bands.

To satisfy consumer demand for small form factor wireless devices, manufacturers are continually striving to reduce the size of components that are used in these devices while providing enhanced functionality. Particularly in configurations in which an electronic device is used in transmitting and receiving radio-frequency signals in cellular telephone bands and other communications bands that have relatively wide bandwidths, it can be challenging to meet desired antenna performance criteria in a compact device. High transmit powers and wide antenna bandwidths can be desirable to ensure adequate signal strength during communications, but these attributes may give rise to challenges with controlling emitted radiation levels.

It is generally impractical to completely shield a user of an electronic device from transmitted radio-frequency signals. For example, conventional cellular telephone handsets generally emit signals in the vicinity of a user's head during telephone calls. Government regulations limit radio-frequency signal powers. At the same time, wireless carriers require that the user equipment that is used in their networks be capable of producing certain minimum radio-frequency powers so as to ensure satisfactory operation of the equipment.

In many jurisdictions, specific absorption rate (SAR) standards are in place that impose maximum energy absorption limits on handset manufacturers. These standards place restrictions on the amount of radiation that may be emitted at any particular point within a given distance of an antenna. Particular attention is given to radiation limits at distances of about 1-20 mm from a device, where users are likely to place a body part near an antenna.

Satisfactory antenna performance and regulatory compliance can be ensured by using an antenna does not exhibit local hotspots in which emitted radiation exceeds desired power levels. A proximity sensor may also be used to detect when an external object such as a user's body is in the vicinity of the antenna. When the presence of the external object is detected, transmitted power levels can be reduced.

A proximity sensor may be implemented using capacitor electrode structures. The capacitor electrode structures can be used to make capacitance measurements. Changes in the measured capacitance values from the capacitor electrode structures reflect changes in the distance of external objects to the capacitor electrode structures.

Antenna structures may be implemented using patterned conductive traces on a substrate. For example, an antenna resonating element for an antenna may be formed from patterned metal traces on a printed circuit substrate.

To minimize the amount of space that is consumed in an electronic device, antenna structures and proximity sensor structures can be integrated. For example, patterned conductive structures that serve as an antenna resonating element can also serve as one or more capacitor electrodes for a capacitive proximity sensor. Coupling circuits can be used to couple a radio-frequency transceiver and a capacitance measurement circuit to the conductive structures.

Any suitable electronic devices may be provided with integrated antenna and proximity sensor structures. As an example, integrated antenna and proximity sensor structures may be formed in electronic devices such as desktop computers, portable computers such as laptop computers and tablet computers, handheld electronic devices such as cellular telephones, etc. With one suitable configuration, which is sometimes described herein as an example, integrated antenna and proximity sensor structures are formed in relatively compact electronic devices in which interior space can be valuable. These compact devices may be portable electronic devices.

Portable electronic devices that may be provided with antennas and proximity sensors include laptop computers and small portable computers such as ultraportable computers, netbook computers, and tablet computers. Portable electronic devices may also be somewhat smaller devices. Examples of smaller portable electronic devices that may be provided with antennas include cellular telephones, wrist-watch devices, pendant devices, headphone and earpiece devices, and other wearable and miniature devices.

Space is at a premium in portable electronic devices and housings for these devices are sometimes constructed from conductive materials that block antenna signals. Arrangements in which antenna structures and proximity sensors are formed behind a window (sometimes referred to as an antenna window, dielectric window, or radio-frequency window) that allows electromagnetic signals to pass can help address these challenges. Windows may be formed in conductive housing walls by forming a dielectric window structure from an opening in the conductive housing wall. If desired, slot-based electromagnetic signal windows may be formed in conductive housing walls. In a slot-based window, the window region is defined by a pattern of window slots. Antenna and proximity sensor components can also be located adjacent to other dielectric structures such as display cover layers (cover glass) that allow radio-frequency signals to pass.

In electronic devices that contain conductive housing structures such as a metal housing walls and internal metal housing structure, the conductive housing structures can serve as all or part of a ground plane. The ground plane may form antenna ground for one or more antennas in the device. The ground plane may also include conductive structures associated with electronic components (e.g., integrated circuits, sensors, switches, connectors, etc.), conductive traces on printed circuits (e.g., ground plane traces on flexible or rigid printed circuit board), or other conductive structures in an electronic device.

In a typical configuration, an antenna may be formed from the ground plane (antenna ground) and the integral antenna-proximity-sensor structures (serving as an antenna resonating element). The antenna can be fed using a positive antenna feed terminal that is coupled to the antenna resonating element and using a ground antenna feed terminal that is coupled to the ground plane (e.g., a conductive housing). During operation, radio-frequency signals for the antenna can pass through the antenna window, a portion of a display cover glass, or other radio-transparent structures. The integral antenna-proximity-sensor structures may also be coupled to proximity sensor processing circuitry that uses capacitance measurements to detect the presence of external objects.

A proximity-based antenna power control circuit may be used to reduce near-field electromagnetic radiation intensities when the presence of an external object is detected in the vicinity of the proximity sensor that is formed using the integral antenna-proximity-sensor structures. Because the sensor electrode structures and antenna resonating element structures are formed as parts of an integral set of structures, capacitance changes that are measured using the sensor electrode structures are reflective of whether or not an external object is located in the vicinity of the antenna.

Antenna and proximity sensor structures with configurations such as these can be mounted in any suitable exposed portion of a portable electronic device. For example, antennas and proximity sensor structures can be provided on the front or top surface of a device. In a tablet computer, cellular telephone, or other device in which the front of the device is all or mostly occupied with conductive structures such as a touch screen display, it may be desirable to form at least part of an antenna window on a rear device surface and/or along an edge of the device or to use a dielectric rear housing configuration. Other configurations are also possible (e.g., with antennas and proximity sensors mounted in more confined locations, on device sidewalls, etc.). The use of antenna-and-proximity-sensor-structure mounting locations in which at least part of a dielectric radio-frequency signal window is formed in a conductive rear housing surface is sometimes described herein as an example, but, in general, any suitable antenna mounting location may be used in an electronic device if desired.

An illustrative portable device that may include one or more integral antenna-resonating-element-and-proximity-sensor-electrode structures is shown in FIG. 1. As shown in FIG. 1, device 10 may be a relatively thin device such as a tablet computer. Device 10 may have display such as display 50 mounted on its front (top) surface. Housing 12 may have curved portions that form the edges of device 10 and a relatively planar portion that forms the rear surface of device 10 (as an example). A radio-frequency (RF) window (sometimes referred to as an antenna window) such as RF window 58 may be formed in housing 12. Antenna and proximity sensor structures for device 10 may be formed in the vicinity of window 58.

Device 10 may have user input-output devices such as button 59. Display 50 may be a touch screen display that is used in gathering user touch input. The surface of display 50 may be covered using a dielectric member such as a planar cover glass member. The central portion of display 50 (shown as region 56 in FIG. 1) may be an active region that is sensitive to touch input. The peripheral regions of display 50 such as regions 54 may be inactive regions that are free from touch sensor electrodes. A layer of material such as an opaque ink may be placed on the underside of display 50 in peripheral regions 54 (e.g., on the underside of the cover glass). This layer may be transparent to radio-frequency signals. The conductive touch sensor electrodes in region 56 may tend to block radio-frequency signals. However, radio-frequency signals may pass through the cover glass and opaque ink in inactive display regions (as an example). In the opposite direction, radio-frequency signals may pass through antenna window 58. Lower-frequency electromagnetic fields also pass through window 58, so capacitance measurements for a proximity sensor may be made through antenna window 58.

Housing 12 may be formed from one or more structures. For example, housing 12 may include an internal frame and planar housing walls that are mounted to the frame. Housing 12 may also be formed from a unitary block of material such as a cast or machined block of aluminum. Arrangements that use both of these approaches may also be used if desired.

Housing 12 may be formed of any suitable materials including plastic, wood, glass, ceramics, metal, fiber-based composites such as carbon fiber composites, other suitable materials, or a combination of these materials. In some situations, portions of housing 12 may be formed from a dielectric or other low-conductivity material, so as not to disturb the operation of conductive antenna elements that are located in proximity to housing 12. In other situations, housing 12 may be formed from metal elements. An advantage of forming housing 12 from metal or other structurally sound conductive materials is that this may improve device aesthetics and may help improve durability and portability.

With one suitable arrangement, housing 12 may be formed from a metal such as aluminum. Portions of housing 12 in the vicinity of antenna window 58 may be used as antenna ground. Antenna window 58 may be formed from a dielectric material such as polycarbonate (PC), acrylonitrile butadiene styrene (ABS), a PC/ABS blend, or other plastics (as examples). Window 58 may be attached to housing 12 using adhesive, fasteners, or other suitable attachment mechanisms. To ensure that device 10 has an attractive appearance, it may be desirable to form window 58 so that the exterior surfaces of window 58 conform to the edge profile exhibited by housing 12 in other portions of device 10. For example, if housing 12 has straight edges 12A and a flat bottom surface, window 58 may be formed with a right-angle bend and vertical sidewalls. If housing 12 has curved edges 12A, window 58 may have a similarly curved surface.

Figure 2:
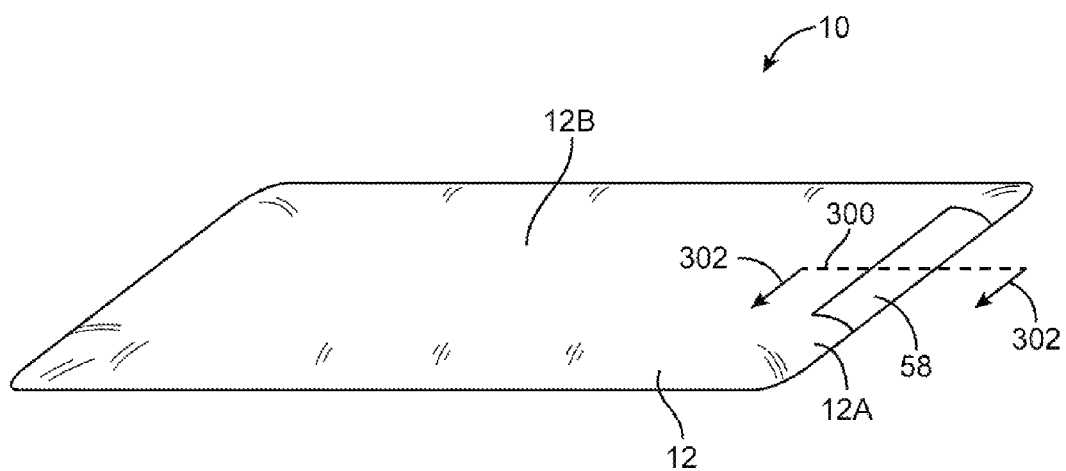
FIG. 2 is a rear perspective view of an illustrative electronic device such as the electronic device of FIG. 1 in accordance with an embodiment of the present invention.

FIG. 2 is a rear perspective view of device 10 of FIG. 1 showing how device 10 may have a relatively planar rear surface 12B and showing how antenna window 58 may be rectangular in shape with curved portions that match the shape of curved housing edges 12A.

Figure 3:
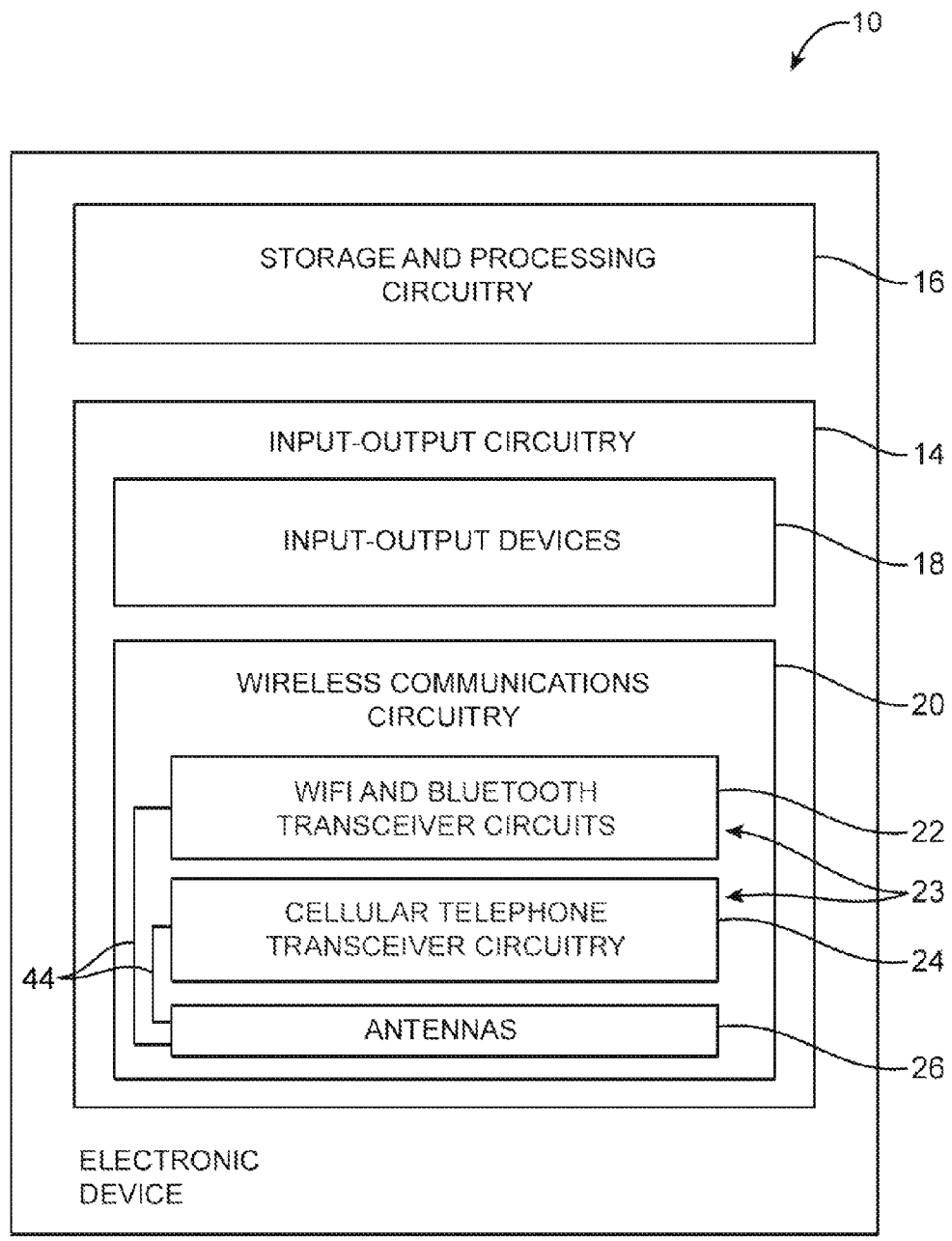
FIG. 3 is a schematic diagram of an illustrative electronic device in accordance with an embodiment of the present invention.

A schematic diagram of device 10 showing how device 10 may include one or more antennas 26 and transceiver circuits that communicate with antennas 26 is shown in FIG. 3. Electronic device 10 of FIG. 3 may be a portable computer such as a laptop computer, a portable tablet computer, a mobile telephone, a mobile telephone with media player capabilities, a handheld computer, a remote control, a game player, a global positioning system (GPS) device, a desktop computer, a music player, a combination of such devices, or any other suitable electronic device.

As shown in FIG. 3, electronic device 10 may include storage and processing circuitry 16. Storage and processing circuitry 16 may include one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 16 may be used to control the operation of device 10. Processing circuitry 16 may be based on a processor such as a microprocessor and other suitable integrated circuits. With one suitable arrangement, storage and processing circuitry 16 may be used to run software on device 10, such as internet browsing applications, voice-over-internet-protocol (VOIP) telephone call applications, email applications, media playback applications, operating system functions, control functions for controlling radio-frequency power amplifiers and other radio-frequency transceiver circuitry, etc. Storage and processing circuitry 16 may be used in implementing suitable communications protocols. Communications protocols that may be implemented using storage and processing circuitry 16 include internet protocols, cellular telephone protocols, wireless local area network protocols (e.g., IEEE 802.11 protocols—sometimes referred to as WiFi®), protocols for other short-range wireless communications links such as the Bluetooth° protocol, etc.

Input-output circuitry 14 may be used to allow data to be supplied to device 10 and to allow data to be provided from device 10 to external devices. Input-output devices 18 such as touch screens and other user input interface are examples of input-output circuitry 14. Input-output devices 18 may also include user input-output devices such as buttons, joysticks, click wheels, scrolling wheels, touch pads, key pads, keyboards, microphones, cameras, etc. A user can control the operation of device 10 by supplying commands through such user input devices. Display and audio devices may be included in devices 18 such as liquid-crystal display (LCD) screens, light-emitting diodes (LEDs), organic light-emitting diodes (OLEDs), and other components that present visual information and status data. Display and audio components in input-output devices 18 may also include audio equipment such as speakers and other devices for creating sound. If desired, input-output devices 18 may contain audio-video interface equipment such as jacks and other connectors for external headphones and monitors.

Wireless communications circuitry 20 may include radio-frequency (RF) transceiver circuitry 23 formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Wireless communications circuitry 20 may include radio-frequency transceiver circuits for handling multiple radio-frequency communications bands. For example, circuitry 20 may include transceiver circuitry 22 that handles 2.4 GHz and 5 GHz bands for WiFi (IEEE 802.11) communications and the 2.4 GHz Bluetooth communications band. Circuitry 20 may also include cellular telephone transceiver circuitry 24 for handling wireless communications in cellular telephone bands such as the GSM bands at 850 MHz, 900 MHz, 1800 MHz, and 1900 MHz, and the 2100 MHz data band (as examples). Wireless communications circuitry 20 can include circuitry for other short-range and long-range wireless links if desired. For example, wireless communications circuitry 20 may include global positioning system (GPS) receiver equipment, wireless circuitry for receiving radio and television signals, paging circuits, etc. In WiFi and Bluetooth links and other short-range wireless links, wireless signals are typically used to convey data over tens or hundreds of feet. In cellular telephone links and other long-range links, wireless signals are typically used to convey data over thousands of feet or miles.

Wireless communications circuitry 20 may include antennas 26 such as the antenna located adjacent to antenna window 58 of FIGS. 1 and 2. Antennas 26 may be single band antennas that each cover a particular desired communications band or may be multiband antennas. A multiband antenna may be used, for example, to cover multiple cellular telephone communications bands. If desired, a dual band antenna may be used to cover two WiFi bands (e.g., 2.4 GHz and 5 GHz). Different types of antennas may be used for different bands and combinations of bands. For example, it may be desirable to form a dual band antenna for forming a local wireless link antenna, a multiband antenna for handling cellular telephone communications bands, and a single band antenna for forming a global positioning system antenna (as examples).

Transmission line paths 44 may be used to convey radio-frequency signals between transceivers 22 and 24 and antennas 26. Radio-frequency transceivers such as radio-frequency transceivers 22 and 24 may be implemented using one or more integrated circuits and associated components (e.g., switching circuits, matching network components such as discrete inductors, capacitors, and resistors, and integrated circuit filter networks, etc.). These devices may be mounted on any suitable mounting structures. With one suitable arrangement, transceiver integrated circuits may be mounted on a printed circuit board. Paths 44 may be used to interconnect the transceiver integrated circuits and other components on the printed circuit board with antenna structures in device 10. Paths 44 may include any suitable conductive pathways over which radio-frequency signals may be conveyed including transmission line path structures such as coaxial cables, microstrip transmission lines, stripline transmission lines, etc. Paths 44 may include ground signal lines and corresponding positive signal lines.

Antennas 26 may, in general, be formed using any suitable antenna types. Examples of suitable antenna types for antennas 26 include antennas with resonating elements that are formed from patch antenna structures, inverted-F antenna structures, closed and open slot antenna structures, loop antenna structures, monopoles, dipoles, planar inverted-F antenna structures, hybrids of these designs, etc. With one suitable arrangement, which is sometimes described herein as an example, part of housing 12 (e.g., the portion of housing 12 in the vicinity of antenna window 58) may form a ground for the antenna associated with window 58. Other ground structures may be used in forming the ground for the antenna in device 10 if desired (e.g., ground structures that are part of rigid and/or flexible printed circuits boards, conductive device components, etc.).

Figure 4:
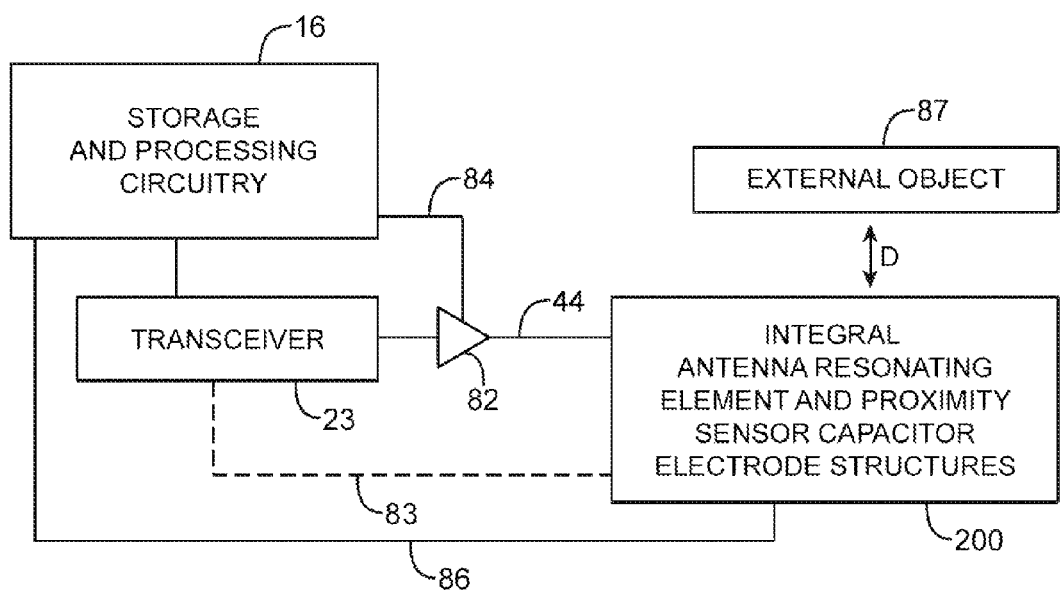
FIG. 4 is a circuit diagram of radio-frequency communications circuitry and proximity sensor circuitry that may be used in an electronic device such as the electronic device of FIG. 1 in accordance with an embodiment of the present invention.

To minimize space within device 10, one or more of antennas 26 may be implemented using conductive structures that serve as both antenna resonating element structures and capacitive proximity sensor electrodes. The conductive structures are used to form integrated antenna resonating element and proximity capacitor sensor electrode structures 200 of FIG. 4. As illustrated in the circuit diagram of FIG. 4, structures 200 may be coupled to a radio-frequency transceiver such as radio-frequency transceiver 23 to transmit and receive antenna signals. The conductive structures may also be coupled to proximity sensor processing circuitry in storage and processing circuitry 16 to make proximity sensor measurements. Proximity sensor signals (e.g., capacitance measurements) from the capacitor electrodes in structures 200 are made using the same conductive components that are serving as an antenna resonating element, so these proximity sensor signals are representative of the distance between external objects and the antenna.

Proximity measurements made using structures 200 may be used in controlling the power of the antenna signals that are transmitted by device 10 through structures 200. Proximity sensor signals (capacitance measurements) may be conveyed to storage and processing circuitry 16 from structures 200 using path 86. The proximity sensor signals (capacitance measurements) from structures 200 may be processed using a capacitance-to-digital converter and/or other sensor signal processing circuits in circuitry 16 to produce analog and/or digital proximity data. the proximity data may, for example, be Boolean data indicating that object 87 is or is not within a given predetermined distance of structures 200 or may be continuous data representing a current distance value for D.

Storage and processing circuitry 16 may be coupled to transceiver circuitry 23 and power amplifier circuitry 82. Dashed line 83 shows how received radio-frequency signals can be conveyed from the antenna that is formed using structures 200 to transceiver circuitry 23. During data transmission operations, control lines 84 may be used to convey control signals from storage and processing circuitry 16 to transceiver circuitry 23 and power amplifier circuitry 82 to adjust output powers in real time. For example, when data is being transmitted, transceiver 23 and is associated output amplifier 82 can be directed to increase or decrease the power level of the radio-frequency signal that is being provided to the antenna over transmission line 44 to ensure that regulatory limits for electromagnetic radiation emission are satisfied.

If the proximity sensor has not detected the presence of external object 87, power can be provided at a relatively high (unrestricted) level. If, however, proximity sensor measurement indicate that the user's leg or other body part or other external object 87 is in the immediate vicinity of the antenna and proximity sensor formed from structures 200 (e.g., within 20 mm or less, within 15 mm or less, within 10 mm or less, etc.), storage and processing circuitry can respond accordingly by directing transceiver circuitry 23 and/or power amplifier 82 to transmit radio-frequency signals through transmission line 44 at reduced powers.

Figure 5:
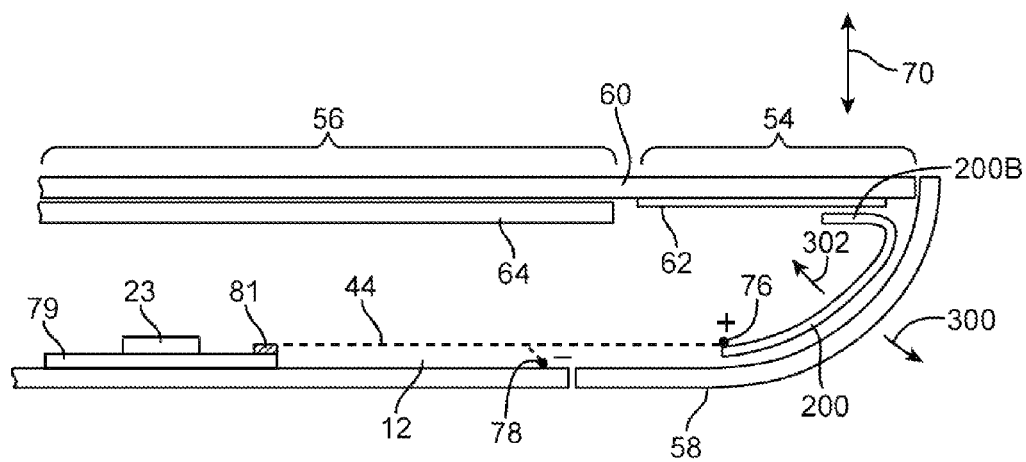
FIG. 5 is a cross-sectional side view of a portion of the electronic device of FIGS. 1 and 2 in accordance with an embodiment of the present invention.

A cross-sectional view of device 10 taken along line 300 of FIG. 2 and viewed in direction 302 is shown in FIG. 5. As shown in FIG. 5, structures 200 may be mounted within device 10 in the vicinity of RF window (antenna window) 58. Structures 200 serve as an antenna resonating element for an antenna. The antenna may be fed using transmission line 44. Transmission line 44 may have a positive signal conductor that is coupled to positive antenna feed terminal 76 and a ground signal conductor that is coupled to antenna ground (e.g., housing 12 and other conductive structures) at ground antenna feed terminal 78.

The antenna resonating element formed from structures 200 may be based on any suitable antenna resonating element design (e.g., structures 200 may form a patch antenna resonating element, a single arm inverted-F antenna structure, a dual-arm inverted-F antenna structure, other suitable multi-arm or single arm inverted-F antenna structures, a closed and/or open slot antenna structure, a loop antenna structure, a monopole, a dipole, a planar inverted-F antenna structure, a hybrid of any two or more of these designs, etc.). Housing 12 may serve as antenna ground for antenna 26 or other conductive structures within device 10 may serve as ground (e.g., conductive components, traces on printed circuits, etc.).

Conductive structures 200 may form one or more proximity sensor capacitor electrodes. With one suitable arrangement, structures 200 may be formed from a layer of dielectric material that is coated on two opposing sides with layers of patterned conductor. One of the layers of patterned conductive material may face outwards in direction 300 and the other of the patterned conductive layers may face inwards into housing 12 in direction 302 (as an example). The two layers of patterned conductive material may be electrically isolated from each other by the interposed layer of dielectric to form a parallel plate capacitor. At frequencies below about 1 MHz, the parallel plate capacitor has a relatively high impedance (e.g., forming a DC open circuit), so that the pattered coating layers may serve as independent first and second proximity sensor capacitor electrodes. At frequencies above 1 MHz (e.g., at frequencies above 100 MHz or above 1 GHz), the impedance of the parallel plate capacitor is low, so the patterned conductive layers are effectively shorted together. This allows both of the layers to operate together as a unitary patterned conductor in an antenna resonating element.

During operation of the antenna formed form structures 200, radio-frequency antenna signals can be conveyed through dielectric window 58. Radio-frequency antenna signals associated with structures 200 may also be conveyed through a display cover member such as cover glass 60. Display 50 may have an active region such as region 56 in which cover glass 60 has underlying conductive structure such as display panel module 64. The structures in display panel 64 such as touch sensor electrodes and active display pixel circuitry may be conductive and may therefore attenuate radio-frequency signals. In region 54, however, display 50 may be inactive (i.e., panel 64 may be absent). An opaque ink such as ink 62 may be formed on the underside of transparent cover glass 60 in region 54 to block the antenna resonating element from view. Ink 62 and the dielectric material of cover member 60 in region 54 may be sufficiently transparent to radio-frequency signals that radio-frequency signals can be conveyed through these structures in directions 70.

Figure 6:
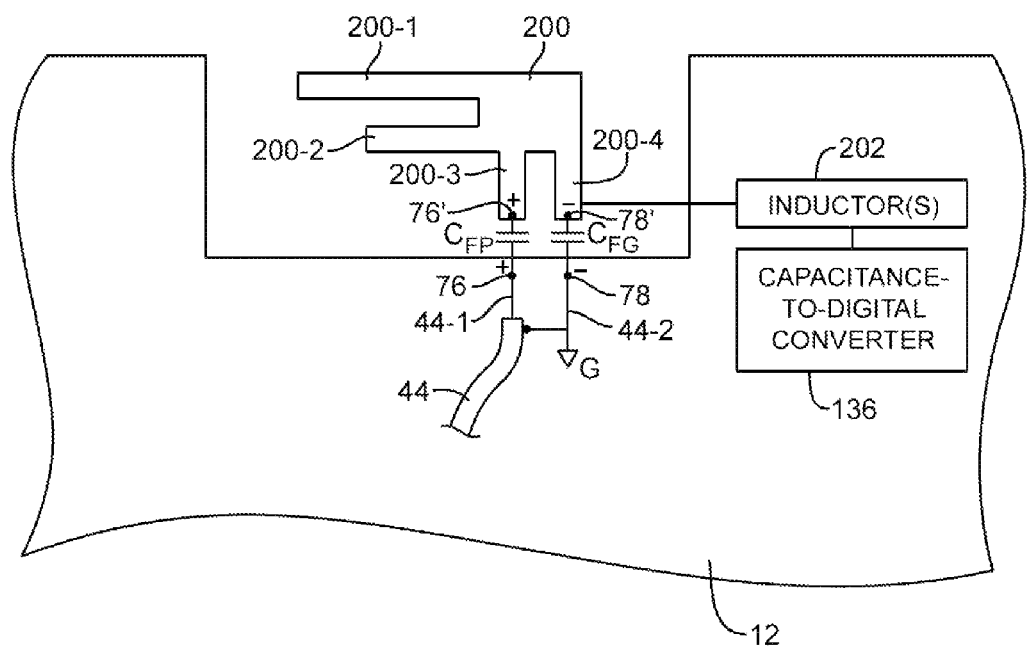
FIG. 6 is a top view of an illustrative integrated antenna and proximity sensor in an electronic device in accordance with an embodiment of the present invention.

FIG. 6 illustrates how structures 200 may be located in an opening in a portion of conductive housing structures 12 (as an example). Window 58 of FIG. 5 is not shown in FIG. 6. The opening in FIG. 6 has the shape of a rectangular recess along one edge of housing structures 12. Openings of other shapes may be used if desired. As shown in FIG. 6, the patterned conductive layers of structures 200 may have the shape of an inverted-F antenna resonating element. In particular, structures 200 may have a main branch such as branch 200-1, one or more additional branches such as branch 200-2 (e.g., to provide additional frequency resonances and/or broadened antenna bandwidth), a short circuit branch such as branch 200-4, and a feed branch such as branch 200-3. Other branches (arms), features such as bends, curved edges, and other shapes may be included if desired.

Transmission line 44 (FIGS. 3 and 5) may be coupled between structures 200 and transceiver circuitry 23 (FIG. 3). Transmission line 44 may have a positive signal line that is connected to positive antenna feed terminal 76 and a ground signal line that is connected to ground antenna feed terminal 78. Positive antenna feed terminal 76 may be coupled to positive antenna feed terminal 76' on antenna resonating element branch 200-3 via capacitor Cfp. Ground antenna feed terminal 78 may be coupled to ground antenna feed terminal 78' on antenna resonating element branch 200-4 via capacitor Cfg.

The capacitance values for capacitors Cfp and Cfg are preferably of sufficient size to ensure that the impedance of these capacitors is low and does not disrupt antenna operation at frequencies associated with wireless signals in device 10. For example, if path 44 is being used to handle signals at frequencies of 100 MHz or more (e.g., cellular telephone signals, wireless local area network signals, etc.), the values of Cfp and Cfg may be 10 pF or more, 100 pF or more (e.g., 100 s of pF), or may have other suitable sizes that ensure that transmitted and received antenna signals are not blocked. At lower frequencies, the impedance of capacitors Cfp and Cfg is preferably sufficiently large to prevent interference from reaching the antenna resonating element formed from structures 200.

Proximity sensor circuitry may be coupled to structures 200 through inductor(s) 202. For example, proximity sensor circuitry such as capacitance-to-digital converter circuitry 136 (part of circuitry 16 of FIG. 3) may be used to make capacitance measurements using one or more capacitor electrodes formed from the patterned conductive layer(s) of structures 200. Inductor(s) 202 may have impedance values (e.g., impedances of 100 s of nH) that prevent radio-frequency antenna signals (e.g., antenna signals at frequencies of 100 MHz or more) from reaching capacitance-to-digital converter 136 or other proximity sensor circuitry while allowing AC proximity sensor signals (e.g., signals with frequencies below 1 MHz) to pass between structures 200 and the proximity sensor circuitry.

Capacitors Cfp and Cfg form a high pass filter. By using high-pass circuitry such as capacitors Cfp and Cfg, low frequency noise can be prevented from interfering with antenna operation for structures 200. Inductor(s) 202 form a low-pass filter. By using low-pass circuitry such as inductor(s) 202, radio-frequency noise from antenna signals can be prevented from interfering with proximity sensor operation for structures 200. If desired, other types of high-pass and low-pass filters may be interposed between structures 200 and the radio-frequency transceiver circuitry and proximity sensor circuitry that is associated with structures 200. The arrangement of FIG. 6 is merely illustrative.

Figure 7:
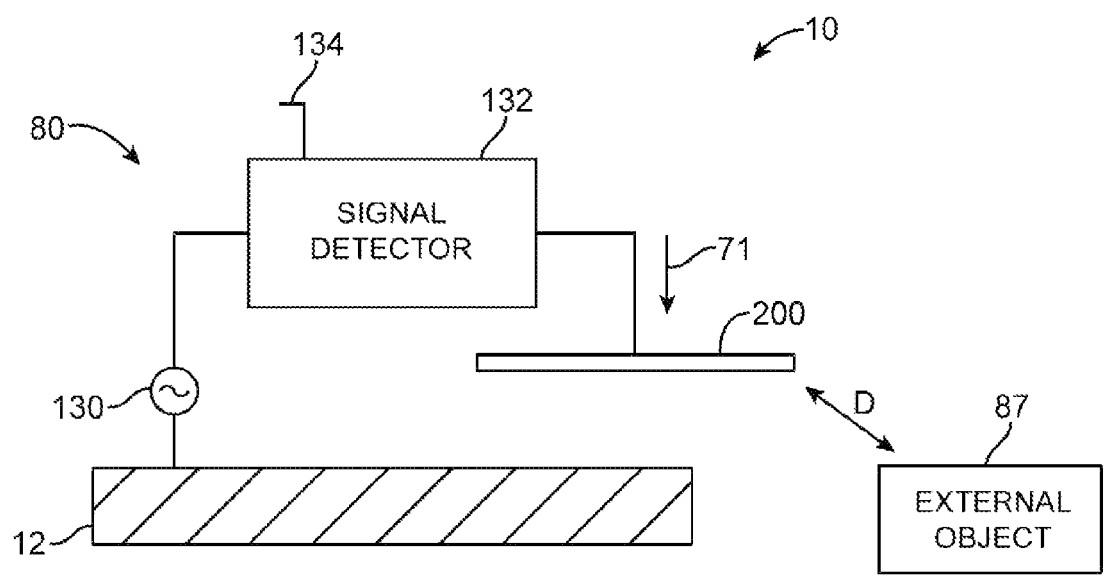
FIG. 7 is a diagram showing how capacitance measurements may be used to determine the distance between a proximity sensor and an external object in accordance with an embodiment of the present invention.

FIG. 7 is a diagram showing how capacitance measurements with conductive structures 200 can be used to measure the distance D between external object 87 and device (i.e., the distance between structures 200 and object 87). Conductive structures 200 may include at least one patterned conductor (e.g., a patterned trace on a printed circuit substrate) that serves as an electrode for capacitive proximity sensor circuitry 80. Circuitry 80 may be, for example, part of circuitry 16 of FIG. 3. Signal generator 130 may be, for example, a voltage source that produces an alternating current (AC) signal at a frequency of about 200-250 kHz (as an example). Signal detector 132 may be a current meter or other suitable measurement circuit for monitoring signals associated with the capacitor electrode(s) formed by conductive structures 200.

During operation, signal detector 132 can monitor the capacitance associated with structures 200. When a user's leg or other external object 87 comes within range of structures 200, the presence of the external object will create a change in capacitance that can be detected by signal detector 132. Signal detector 132 can provide an output signal on line 134 that is indicative of the presence or absence of external object 87 in the vicinity of structures 200. This signal, which may be provided in analog or digital form, may be a Boolean value that has a first logic value (e.g., a logic zero) when external object 87 is not detected and that has a second logic value (e.g., a logic one) when external object 87 is detected.

The output signal on line 134 may also have a level that varies continuously in response to different detected capacitance changes. With this type of arrangement, circuitry 80 may estimate the value of the distance D that separates structures 200 from external object 87. When object 87 is close, proximity sensor circuitry 80 will produce a relatively high value on output 134. When object 87 is far, the proximity sensor circuitry 80 will produce a relatively low value on output 134. The signal on output 134 may be an analog signal (e.g., an analog voltage) or a digital value.

The output signal on path 134 may be fully processed (e.g., to indicate the value of D) or may be a raw signal (e.g., a signal that represents the detected capacitance value from conductive structures 200). Raw signals may be processed further using a processor, application-specific integrated circuits, and other resources associated with storage and processing circuitry 16. Other arrangements may be used if desired. For example, other signal sources may be used, other signal detecting schemes may be used, signal outputs may be provided using a combination of analog and digital signals, etc.

Structures 200 may be formed from any suitable conductive structures that can detect capacitance changes due to the presence of an external object such as a human body part. The shape of structures 200 when viewed from the top (direction 71) may have straight sides, curved sides, mixtures of straight and curve sides, or other suitable shapes. For example, structures 200 may have an inverted-F antenna resonating element shape of the type shown in FIG. 6. The dimensions of structures 200 may be such that the outline of structures 200 fits within the outline of dielectric antenna window 58 (i.e., the rectangular cut-out portion of ground plane 12 in the example of FIG. 6, which may be on the order of 0.5-10 cm in each lateral dimension). In cross-section, the thickness of structures 200 may be less than 1 mm, less than 0.5 mm, less than 0.2 mm, less than 0.1 mm, or any other suitable thickness. Substrates such as rigid and flexible printed circuit board substrates may be used in forming structures 200. Structures 200 may also be formed from metal foil or other conductive materials.

Structures 200 may be formed from a single layer of conductive material or two or more layers of conductive material. Structures 200 may be formed from a flexible printed circuit substrate or a rigid printed circuit substrate. Flexible printed circuits ("flex circuits") may be formed form sheets of flexible polymer or other dielectrics. Rigid printed circuit substrates may be formed from fiberglass-filled epoxy or other suitable materials. The upper and lower patterned conductive layers in a two-layer configuration may be, for example, conductive traces formed from a metal such as copper or copper plated with gold (as examples). The conductive traces may optionally be coated with a dielectric coating. When structures 200 contain two layers, one of the electrode layers may serve as a sensor electrode layer and the other of the electrode layers may serve as an active shield layer.

Figure 8:
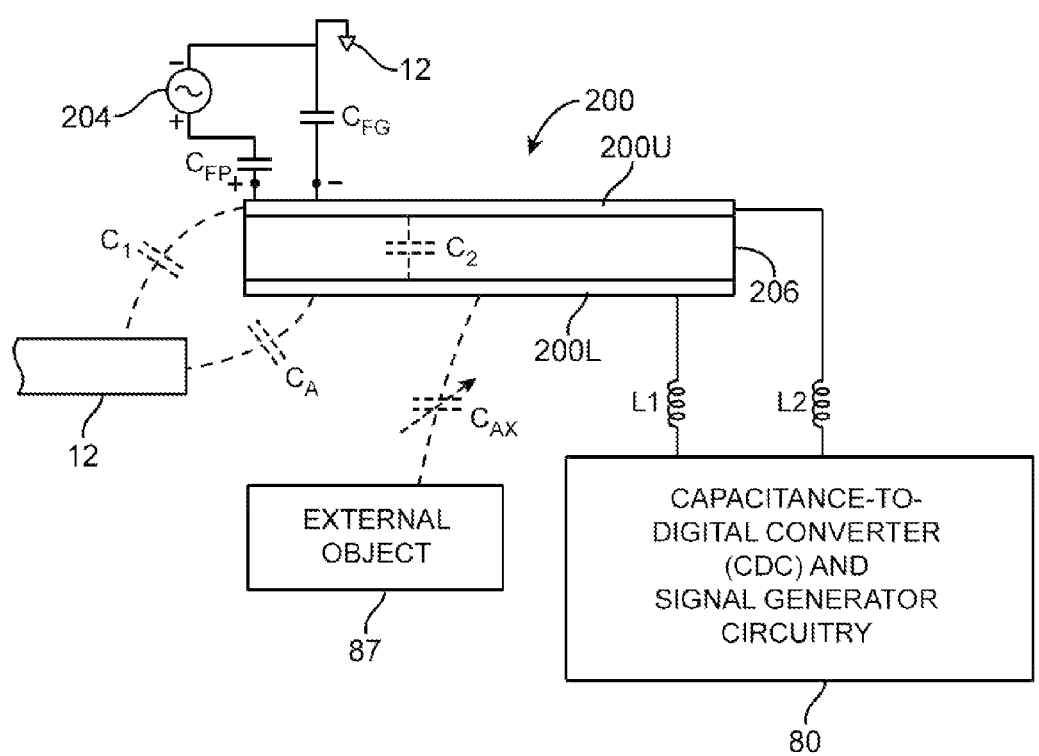
FIG. 8 is a diagram showing how conductive structures with two sides of patterned conductor may be used as an antenna resonating element and a proximity sensor in accordance with an embodiment of the present invention.

FIG. 8 shows circuitry that may be used when simultaneously using dual-layer structures 200 as an antenna resonating element and as proximity sensor capacitor electrodes. As shown in FIG. 8, conductive structures 200 may have first patterned conductive layer 200U and second patterned conductive layer 200L. Patterned conductive layers 200U and 200L may be electrically isolated by a layer of interposed dielectric such as dielectric layer 206. Transceiver circuitry 204 (e.g., circuitry such as transceiver 23 and amplifier 82 of FIG. 4 and associated transmission line 44) may be coupled to first patterned conductive layer 200U by capacitors Cfp and Cfg, as described in connection with FIG. 6.

The pattern used for patterned conductive layer 200U (e.g., the inverted-F antenna resonating element pattern of FIG. 6) may be the same as the pattern used for patterned conductive layer 200L. At the frequencies associated with wireless signals in device 10 (e.g., frequencies above 100 MHz), the capacitance C2 between layers 200U and 200L behaves as a short circuit (i.e., the impedance between layers 200U and 200L is small). As a result, layers 200U and 200L are effectively combined into a single resonating element (having the pattern shared by layers 200U and 200L). If desired, layers 200U and 200L may have different patterns, provided that the resulting combined pattern serves as an effective antenna resonating element when operated at wireless signal frequencies. There is preferably no direct current (DC) short between layers 200U and 200L (i.e., layers 200U and 200L are preferably isolated by interposed dielectric layer 206), so that layers 200U and 200L can be used as part of a two-electrode proximity sensor.

Proximity sensor circuitry 80 may include signal generator circuitry and sensor circuitry. Capacitance-to-digital converter functionality may be provided by circuitry 80 to convert capacitance measurements from electrodes 200U and 200L into proximity sensor data.

Circuitry 80 may be coupled to patterned conductive layer 200U by inductor L2 and to patterned conductive layer 200L by inductor L2. Inductors L1 and L2 may have inductance values of about 200-4000 nH or other suitable values that allow inductors L1 and L2 to serve as radio-frequency chokes (i.e., radio-frequency choke inductors). Radio-frequency signals that are transmitted using structures 200 in their capacity as an antenna resonating element are subject to a relatively high impedance due to the presence of inductors L1 and L2 (inductors 202 of FIG. 6) and are not passed to the capacitance-to-digital converter. At the same time that radio-frequency antenna signals are being blocked by inductors L1 and L2 (which serve as radio-frequency chokes), lower frequency signals such as alternating current (AC) excitation signals in the kHz range that are supplied to structures 200 by source 130 of FIG. 7 (part of circuitry 80 of FIG. 8) can pass between structures 200 and circuitry 80 through inductors L1 and L2. This is because the impedances of inductors L1 and L2 scale with frequency.

Circuitry 80 may be implemented using any suitable capacitive touch sensor control circuit. With one suitable arrangement, circuitry 80 may include capacitance-to-digital converter circuitry such as the AD7147 programmable capacitance-to-digital converter integrated circuit available from Analog Devices of Norwood, Mass. Capacitance-to-digital converter circuitry 80 converts a capacitive input signal on its input to a digital capacitance value on its output for processing by circuitry 16, as described in connection with FIG. 4.

During operation, the measured capacitance C2 between conductive layers 200U and 200L can be minimized by driving proximity signals onto conductors 200U and 200L in parallel. This helps to improve proximity sensor performance. There is typically a fixed capacitance C1 of about 150 pF or less between sensor electrode 200U and housing 12. Capacitance C1 arises from electromagnetic fields within housing 12 and is not responsive to changes in the position of external object 87 with respect to electrode 200U. Fringing electric fields outside of housing 12 give rise to a capacitance CA between conductive layer 200L and housing 12.

Variable capacitance CAX arises between external object 87 and conductive layer 200L. The magnitude of capacitance CAX depends on the distance between external object 87 and electrode layer 200L. When external object 87 is not present, the value of CAX is at a minimum. As object 87 approaches layer 200L, the value of CAX rises. Relatively large values of CAX arise when object 87 is in the vicinity of layer 200L (i.e., when object 87 is less than 2 cm or other suitable distance from layer 200L). Capacitance-to-digital converter circuitry 80 can measure capacitance CAX (which is in parallel with capacitance CA) and can produce a corresponding digital capacitance value. Storage and processing circuitry 16 (FIGS. 3 and 4) may receive the digital capacitance value that has been measured by capacitance-to-digital converter circuit 80 and can compute a corresponding distance value that is indicative of the distance of external object from structures 200.

When external object 87 is in proximity to structures 200 (e.g., when a user places device 10 on the user's lap so that the antenna resonating element formed from structures 200 is close to the user's leg), capacitance-to-digital converter circuitry 80 can output a correspondingly high capacitance value. Storage and processing circuitry 16 can analyze the capacitance signal from capacitance-to-digital converter circuitry 80 and can take appropriate action.

For example, if storage and processing circuitry 16 concludes that external object 87 is more than 2 cm (or other suitable distance) from the antenna formed from structures 200, transceiver circuitry 23 can be allowed to transmit radio-frequency antenna signals at any desired power including the maximum available transmit power for device 10. If, however, storage and processing circuitry 16 concludes that external object 87 is in the vicinity of the antenna, storage and processing circuitry 16 can limit the amount of permissible transmit power from transceivers 23. In this way, storage and processing circuitry 16 can use external object proximity information in determining what radio-frequency output power level to use in operating transceiver circuitry 23. When an external object such as a user's body is close to device 10 and the antenna, the maximum transmit power can be reduced to ensure compliance with regulatory limits. When no external object is in the vicinity of device 10 and the antenna, proximity-based transmit power limits may be removed and larger radio-frequency output powers can be used.

Figure 9:
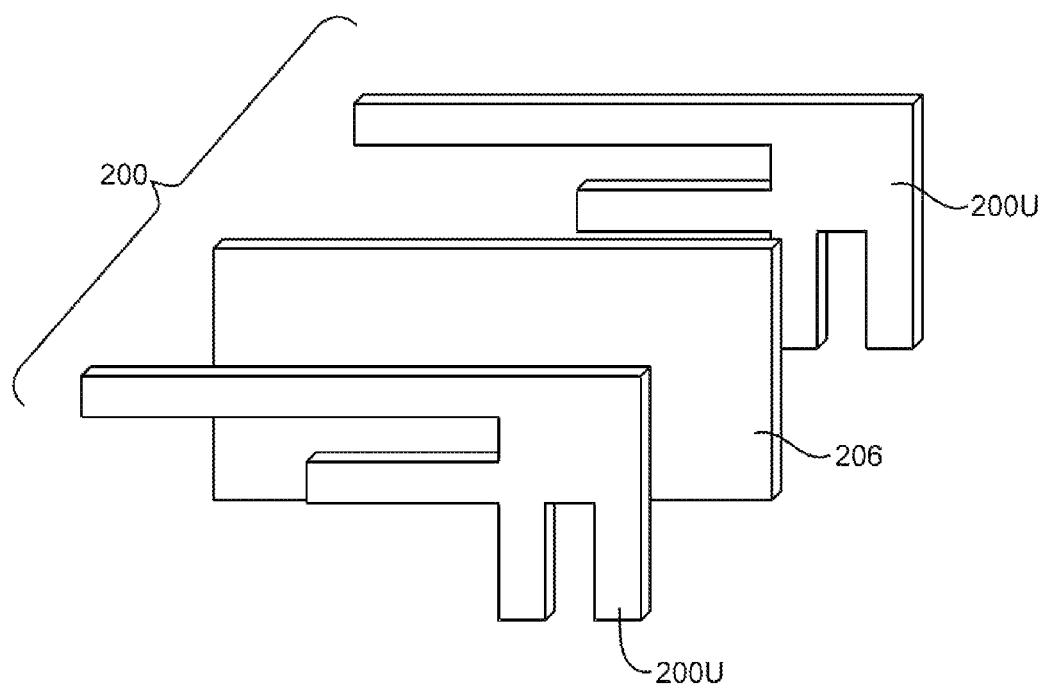
FIG. 9 is an exploded perspective view of an illustrative structure with two patterned conductive layers separated by a layer of dielectric that may be used to implement an integral antenna and proximity sensor structure in accordance with an embodiment of the present invention.

As shown in the exploded perspective view of FIG. 9, conductive structures 200 may, as an example, include substantially identical patterned layers 200L and 200U. If, for example, layer 200L has the shape of an inverted-F antenna resonating element, layer 200U may have the shape of the same inverted-F antenna resonating element. As described in connection with FIG. 8, at the frequencies associated with the antenna signals in device 10, layers 200U and 200L are effectively combined into a single conductive antenna resonating element structure (having the shared inverted-F antenna resonating element shape), because the impedance of capacitor C2 (FIG. 8) is low at high frequencies.

Figure 10:
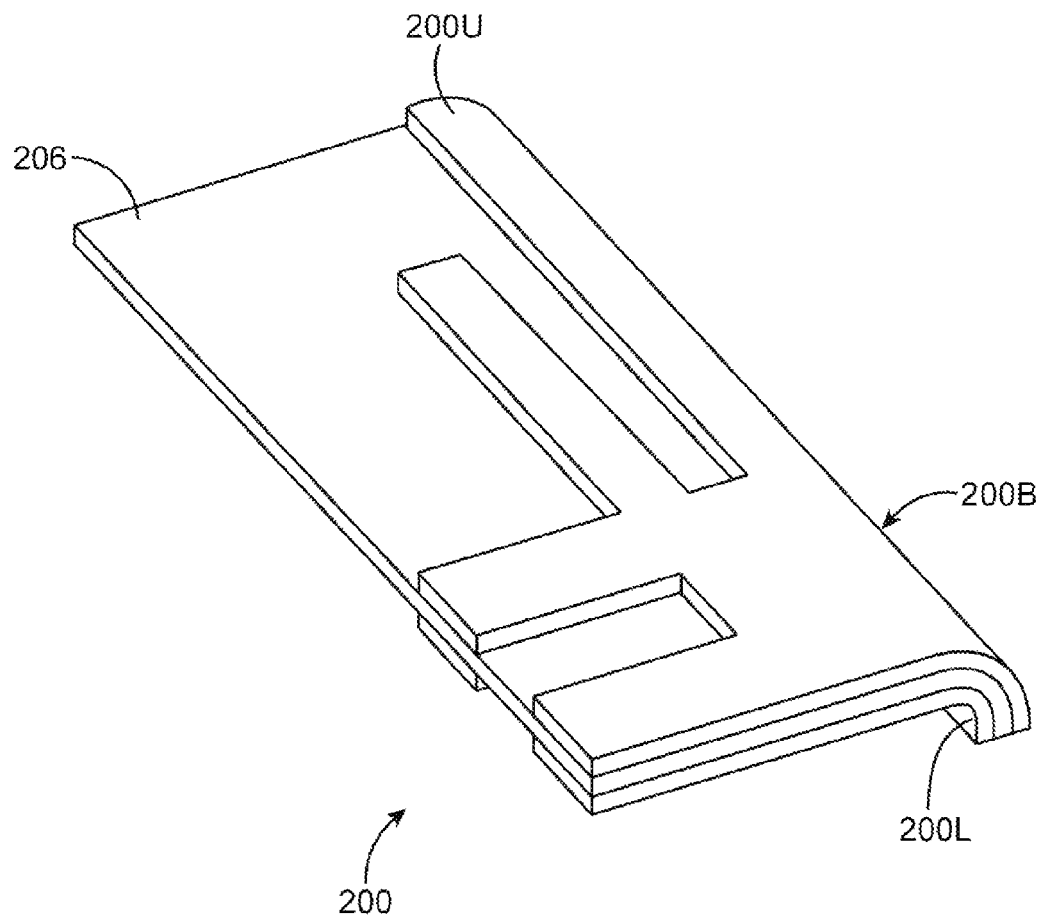
FIG. 10 is a perspective view of a structure of the type shown in FIG. 9 after forming a bend along one edge of the structure to accommodate mounting within an electronic device in accordance with an embodiment of the present invention.

When assembled, conductive structures 200 may appear as shown in FIG. 10. As shown in FIG. 10, conductive structures 200 may be bent (e.g., when conductive structures 200 are formed from a flex circuit). For example, one of the edges of conductive structures 200 may be bent back along its length to form bent edge 200B. Bent edge 200B may allow structures 200 to fit within housing 12 so that bent edge 200B rests under inactive region 54 of display cover glass 60, as shown in FIG. 5. This is merely an illustrative configuration that may be used for mounting conductive structures 200 within housing 12 of device 10. Other configurations may be used if desired (e.g., configurations without bent edges, configurations with multiple bent edges, etc.).

The foregoing is merely illustrative of the principles of this invention and various modifications can be made by those skilled in the art without departing from the scope and spirit of the invention.

What is claimed is:

1. An electronic device, comprising:
a radio-frequency transceiver;
capacitive proximity sensor circuitry;
ground structures; and
conductive structures that are coupled to the radio-frequency transceiver through high-pass circuitry and that are coupled to the capacitive proximity sensor circuitry through low-pass circuitry, wherein the conductive structures include at least one patterned conductor that forms an antenna resonating element that operates with the ground structures to form an antenna through which the radio-frequency transceiver transmits and receives radio-frequency data signals and wherein the at least one patterned conductor forms a capacitor electrode with which the capacitive proximity sensor circuitry makes capacitance measurements.

2. The electronic device defined in claim 1 wherein the high-pass circuitry comprises at least two capacitors.

3. The electronic device defined in claim 2 further comprising a transmission line having positive and ground signal lines, wherein the transceiver circuitry is coupled to the at least one patterned conductor through the positive signal line and a first of the two capacitors and is coupled to the at least one patterned conductor through the ground signal line and a second of the two capacitors.

4. The electronic device defined in claim 3 wherein the at least one patterned conductor comprises one of a pair of patterned conductor layers in the conductive structures and wherein the conductive structures include a dielectric layer interposed between the pair of patterned conductor layers.

5. The electronic device defined in claim 4 wherein the low-pass circuitry comprises a first inductor coupled between the proximity sensor circuitry and a first of the pair of patterned conductors and a second inductor coupled between the proximity sensor circuitry and a second of the pair of patterned conductors.

6. The electronic device defined in claim 5 wherein the first and second patterned conductors have substantially identical patterns.

7. The electronic device defined in claim 6 wherein the first and second patterned conductors have substantially identical inverted-F antenna resonating element patterns.

8. The electronic device defined in claim 2 wherein the ground structures comprise conductive housing structures.

9. The electronic device defined in claim 8 further comprising a dielectric window in the conductive housing structures, wherein the conductive structures are mounted adjacent to the dielectric window.

10. The electronic device defined in claim 9 wherein the conductive structures comprise a flex circuit substrate having a bent edge.

11. The electronic structures defined in claim 10 wherein the conductive structures include a patterned trace that forms an inverted-F antenna resonating element structure for the antenna resonating element.

12. The electronic device defined in claim 2 wherein the conductive structures include first and second patterned conductive layers on opposing sides of a dielectric substrate, the electronic device further comprising:
- a positive antenna feed terminal connected to the first of the patterned conductive layers through a first of the capacitors; and
- a ground antenna feed terminal connected to the first of the patterned conductive layers through a second of the capacitors.

13. An electronic device, comprising:
- a ground;
- radio-frequency transceiver circuitry configured to transmit data through an antenna;
- capacitive proximity sensor circuitry;
- integral antenna resonating element and proximity sensor capacitor electrode structures that are coupled to the capacitive proximity sensor circuitry; and
- positive and ground antenna feed terminals coupled to the integral antenna resonating element and proximity sensor capacitor electrode structures, wherein the radio-frequency transceiver circuitry is coupled to the positive and ground antenna feed terminals and wherein the ground and the integral antenna resonating element and proximity sensor capacitor electrode structures form the antenna.

14. The electronic device defined in claim 13 wherein the integral antenna resonating element and proximity sensor capacitor electrode structures comprises first and second patterned conductor layers on opposing sides of a dielectric layer.

15. The electronic device defined in claim 14 further comprising a first capacitor interposed between the positive antenna feed terminal and the first patterned conductor layer and a second capacitor interposed between the ground antenna feed terminal and the first patterned conductor layer.

16. The electronic device defined in claim 15 wherein the first and second patterned conductor layers have identical shapes and are electrically isolated by the dielectric layer.

17. The electronic device defined in claim 13 wherein the ground comprises conductive housing structures, the electronic device further comprising a dielectric window in the conductive housing structure adjacent to the integral antenna resonating element and proximity sensor capacitor electrode structures.

18. An electronic device, comprising:
- conductive structures having first and second patterned conductive layers formed on opposing sides of a dielectric substrate layer;
- proximity sensor circuitry that is coupled to the first and second patterned conductive layers and that is configured to use capacitance measurements from the first and second patterned conductive layers to produce proximity data reflective of distance between the printed circuit structures and objects external to the electronic device;
- wireless transceiver circuitry; and
- a transmission line that couples the wireless transceiver circuitry to the printed circuit structures, wherein the wireless transceiver circuitry transmits data signals using the first and second patterned conductive layers.

19. The electronic device defined in claim 18 wherein the transmission line comprises first and second signal lines and wherein the electronic device further comprises a first capacitor interposed between the first signal line and the conductive structures and a second capacitor interposed between the second signal line and the conductive structures.

20. The electronic device defined in claim 19 wherein the first and second patterned conductive layers have identical patterns and wherein the first and second patterned conductive layers have an inverted-F antenna resonating element shape with at least a feed branch and a short circuit branch.

21. The electronic device defined in claim 18 wherein the first and second patterned conductive layers have identical patterns and wherein the first and second patterned conductive layers have at least two branches.

* * * * *